United States Patent
Adams et al.

(10) Patent No.: US 9,183,896 B1
(45) Date of Patent: Nov. 10, 2015

(54) DEEP SLEEP WAKEUP OF MULTI-BANK MEMORY

(71) Applicant: International Business Machines Corporation, Armonk, NY (US)

(72) Inventors: Chad A. Adams, Byron, MN (US); Thinh V. Luong, Rochester, MN (US); Jesse D. Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/318,920

(22) Filed: Jun. 30, 2014

(51) Int. Cl.
| | |
|---|---|
| *G11C 5/14* | (2006.01) |
| *G11C 11/4074* | (2006.01) |
| *G11C 8/00* | (2006.01) |
| *G06F 1/26* | (2006.01) |
| *G11C 8/04* | (2006.01) |
| *G11C 11/4072* | (2006.01) |
| *G11C 8/12* | (2006.01) |
| *G06F 1/32* | (2006.01) |
| *G11C 5/06* | (2006.01) |

(52) U.S. Cl.
CPC *G11C 5/148* (2013.01); *G11C 5/14* (2013.01); *G06F 1/266* (2013.01); *G06F 1/3203* (2013.01); *G11C 5/063* (2013.01); *G11C 8/04* (2013.01); *G11C 8/12* (2013.01); *G11C 11/4072* (2013.01); *G11C 11/4074* (2013.01)

(58) Field of Classification Search
CPC ...... G11C 5/14; G11C 5/148; G11C 11/4072; G11C 5/063; G11C 11/4076; G11C 8/04; G11C 8/12; G06F 1/3203; G06F 1/266

USPC .............. 365/194, 227, 230.03; 712/245; 713/300
See application file for complete search history.

(56) References Cited

U.S. PATENT DOCUMENTS

| | | | |
|---|---|---|---|
| 7,551,508 | B2 | 6/2009 | Joshi et al. |
| 8,195,887 | B2 | 6/2012 | Hughes et al. |
| 8,301,928 | B2 | 10/2012 | Sajayan et al. |
| 2006/0101299 | A1 | 5/2006 | Chung |
| 2008/0313482 | A1 | 12/2008 | Karlapalem et al. |
| 2010/0110806 | A1* | 5/2010 | Yun .............................. 365/194 |
| 2010/0262844 | A1* | 10/2010 | Diab et al. ..................... 713/300 |
| 2011/0161595 | A1 | 6/2011 | Fang et al. |
| 2012/0173907 | A1 | 7/2012 | Moses et al. |
| 2013/0198545 | A1* | 8/2013 | Lee et al. ....................... 713/323 |

(Continued)

OTHER PUBLICATIONS

Ishihara, T. et al, "A System Level Memory Power Optimization Technique Using Multiple Supply and Threshold Voltages," VLSI Design and Education Center, The University of Tokyo, Japan, Design Automation Conference, 2001, Proceedings of the ASP-DAC 2001, Asia and South Pacific , vol. No. pp. 456,461, 2001, doi: 10.1109/ASPDAC.2001.913350.
Adams, C. et al., "Deep Sleep Wakeup of Multi-Bank Memory," U.S. Appl. No. 14/460,972, filed Aug. 15, 2014, IBM.

(Continued)

*Primary Examiner* — Ly D Pham
(74) *Attorney, Agent, or Firm* — Scott S. Dobson; Robert Williams

(57) ABSTRACT

A deep sleep wakeup signal is received at a first memory bank. A first gated memory array supply voltage is increased in response to the receiving the deep sleep wakeup signal at the first memory bank. The first memory array supply voltage is applied to a first memory array. The deep sleep wakeup signal is forwarded to a second memory bank in response to determining the first gated memory array supply voltage has reached a specified voltage.

4 Claims, 4 Drawing Sheets

(56) References Cited

U.S. PATENT DOCUMENTS

2014/0189401 A1* 7/2014 Keppel et al. .......... 713/323
2014/0354346 A1* 12/2014 Tsai et al. .......... 327/399

OTHER PUBLICATIONS

IBM, "List of IBM Patents or Patent Applications Treated as Related.".

* cited by examiner

DEEP SLEEP WAKEUP OF MULTI-BANK MEMORY

BACKGROUND

The present disclosure relates to computer memory systems, and more specifically, to switching between power states in a multi-bank memory.

Memory arrays can be put into a deep sleep mode where the power supply is removed from the memory arrays. Waking up the memory arrays from deep sleep involves powering the arrays back to full power. Powering up multiple memory bank arrays simultaneously can result in drawing excessive current from the power grid.

SUMMARY

According to embodiments of the present disclosure, a method for waking up a plurality of memory banks from deep sleep is disclosed. The method includes receiving a deep sleep wakeup signal at a first memory bank. The method further includes increasing a first gated memory array supply voltage in response to the receiving the deep sleep wakeup signal at the first memory bank. The first memory array supply voltage is applied to a first memory array. The method further includes determining the first gated memory array supply voltage has reached a specified voltage. The method further includes forwarding the deep sleep wakeup signal to a second memory bank in response to the determining the first gated memory array supply voltage has reached the specified voltage.

Further disclosed herein are embodiments of a system. The system includes a first memory bank with a first memory array. The first memory bank is configured to increase a first gated memory array voltage in response to receiving a deep sleep wakeup signal. The first gated memory array voltage is applied to the first memory array. The system further includes a second memory bank with a second memory array. The second memory bank is configured to increase a second gated memory array voltage in response to receiving the deep sleep wakeup signal. The second gated memory array voltage is applied to the second memory array. The system further includes a first deep sleep wakeup delay circuit configured to forward the deep sleep wakeup signal received at the first memory bank to the second memory bank in response to determining the first gated memory array supply voltage has reached a specified voltage.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
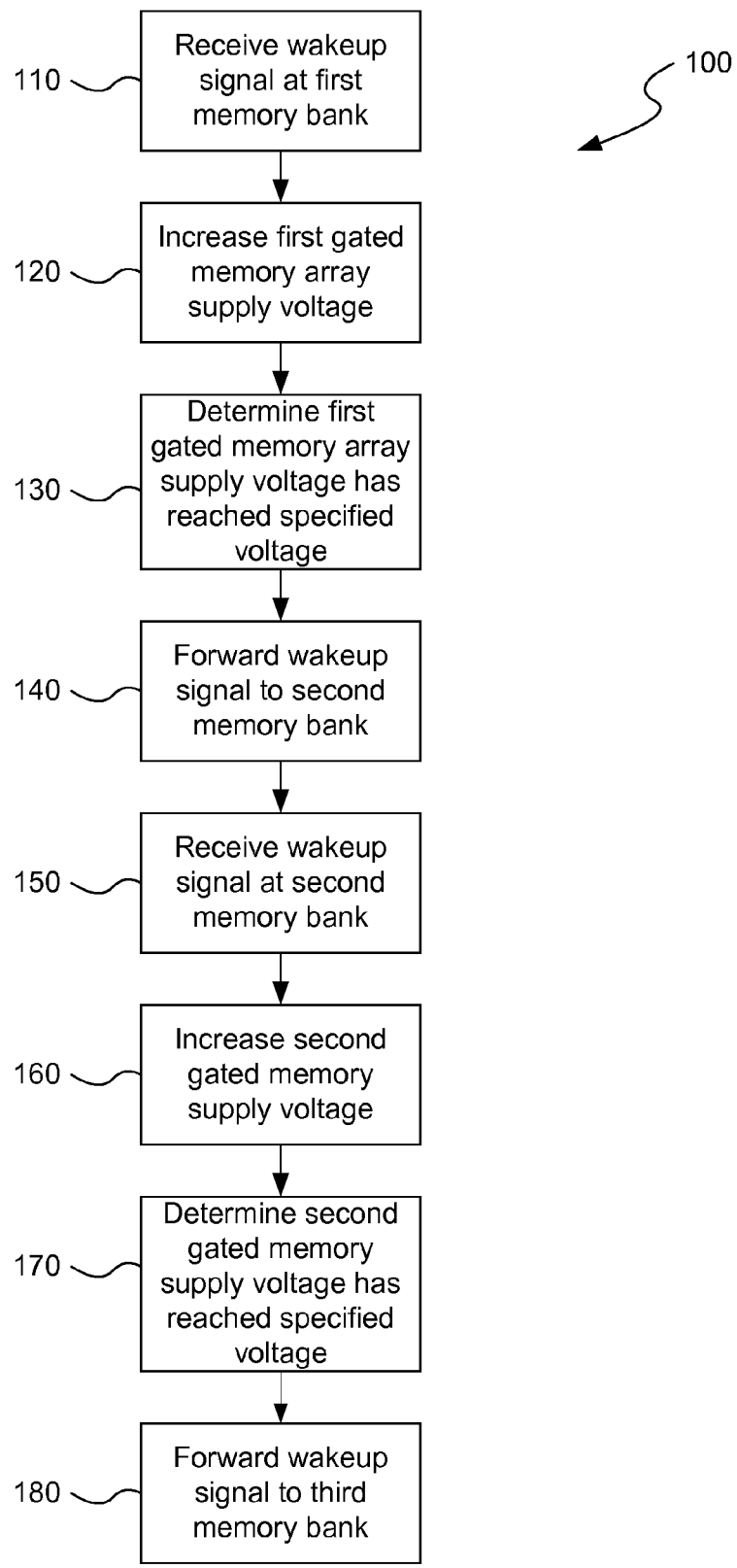
FIG. 1 depicts a flow diagram of an example method for waking up a plurality of memory banks from deep sleep.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to waking-up multi-bank memory arrays from deep sleep, and more particular aspects relate to delaying the wake-up of a subsequent memory array until the previous memory array is powered up. While the present disclosure is not necessarily limited to such applications, various aspects of the disclosure may be appreciated through a discussion of various examples using this context.

Embodiments of the present disclosure may provide for waking multi-bank memory arrays from deep sleep by delaying the propagation of a deep sleep wakeup signal to a subsequent bank until the current bank has reached a specified voltage. A circuit may be configured to receive the deep sleep wakeup signal at a first bank, power up a gated memory array supply voltage to a first memory array at the first memory bank, and forward the deep sleep wakeup signal to the next bank when the gated memory array supply voltage reaches a specified voltage. The specified voltage may be close to the maximum gated memory array supply voltage or some lesser voltage at which it is acceptable to start waking up the next memory bank. The specified voltage may be near maximum for the gated memory array supply voltage to prevent drawing excessive current from the power grid. This process may be repeated at any number of memory banks.

Referring to FIG. 1, a flow diagram of an example method 100 for waking up a plurality of memory banks from deep sleep is depicted. At block 110 a deep sleep wakeup signal is received at a first memory bank. At block 120, a first gated memory array supply voltage is increased toward a supply voltage (VCS) in response to receiving the deep sleep wakeup signal. The first gated memory array supply voltage supplies power to a first memory array at the first memory bank. The first gated memory array supply voltage may further supply power to a first word line driver. At block 130, it is determined that the first gated memory array supply voltage has reached a specified voltage. As described herein, this may be performed using a NAND gate configured to lower output voltage in response to input from the first gated memory array supply voltage reaching the specified voltage. The NAND gate may be skewed such that the specified voltage may be near VCS. At block 140, the deep sleep wakeup signal is forwarded to a second memory bank in response to determining that the first gated memory array supply voltage has reached the specified voltage.

At block 150, the deep sleep wakeup signal is received at the second memory bank. At block 160, a second gated memory array supply voltage is increased in response to receiving the deep sleep wakeup signal. The second gated memory array supply voltage supplies power to a second memory array at the second memory bank. At block 170, it is determined that the second gated memory array supply voltage has reached the specified voltage. At block 180, the deep sleep wakeup signal is forwarded to a third memory bank in response to determining that the second gated memory array supply voltage has reached the specified voltage.

Figure 2:
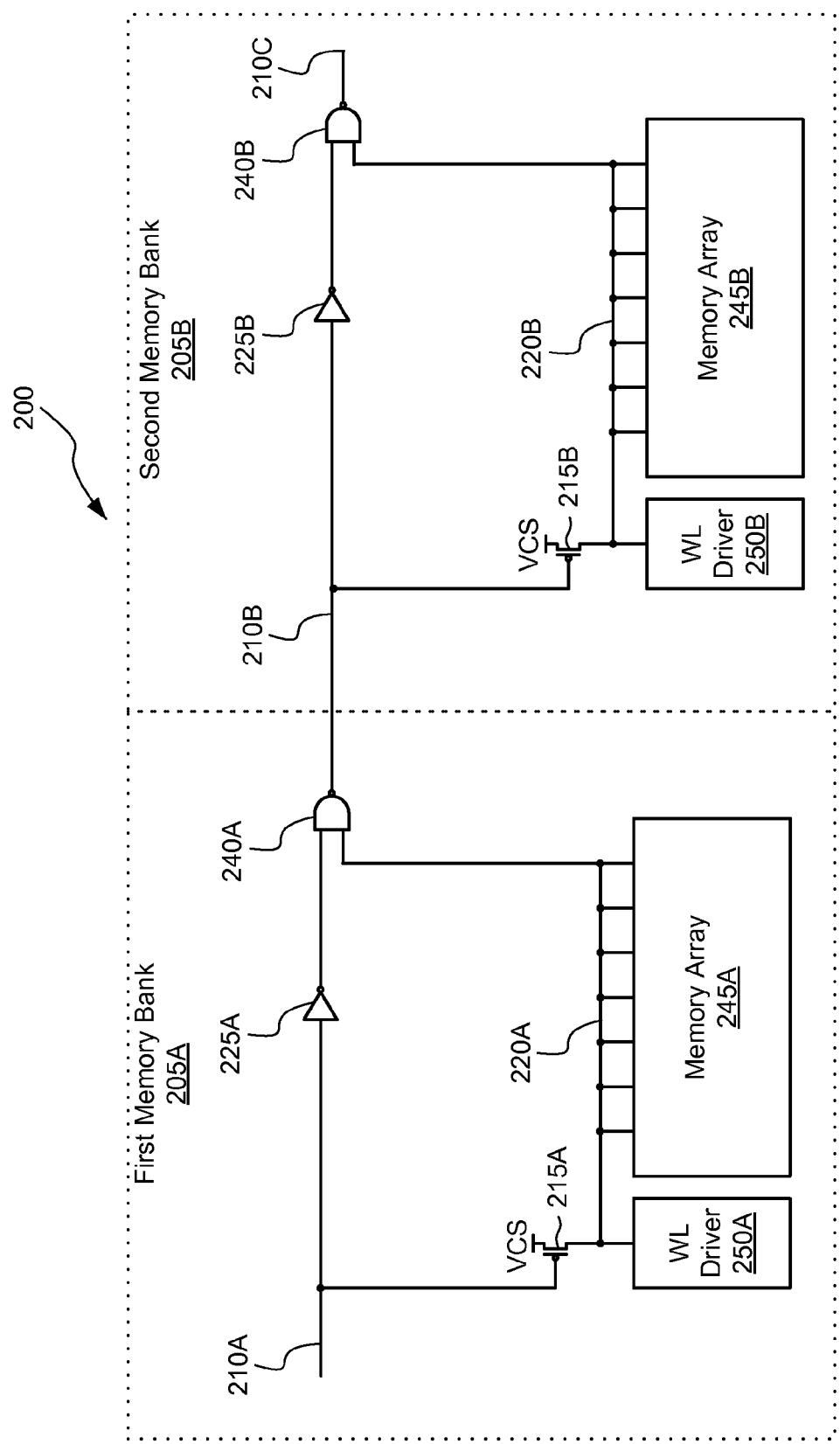
FIG. 2 depicts a diagram of an example system for waking up a plurality of memory banks from deep sleep.

Referring to FIG. 2, a diagram of an example system 200 for waking up a plurality of memory banks from deep sleep is depicted. System 200 includes a first memory bank 205A and a second memory bank 205B. First memory bank 205A includes memory array 245A and word line driver 250A. Second memory bank 205B includes memory array 245B and word line driver 250B.

At an initial condition, with the memory banks in deep sleep, the deep sleep signal 210A may be high. With deep sleep signal 210A high, p-channel field-effect transistor (PFET) 215A is off and gated memory array supply voltage 220A is low. Inverter 225A inverts high deep sleep signal 210A and outputs a low signal. NAND gate 240A outputs a high deep sleep signal 210B in response to the low input signal from inverter 225A.

Similarly, with deep sleep signal 210B high, PFET 215B is off and gated memory array supply voltage 220B is low. Inverter 225B inverts deep sleep signal 210B and outputs a low signal. NAND gate 240B outputs a high deep sleep signal 210C in response to the low input signal from inverter 225B.

To wake up the memory banks from deep sleep, deep sleep signal 210A is brought low. Low deep sleep signal 210A causes PFET 215A to turn on and start powering up gated memory array supply voltage 220A. Inverter 225A inverts the low deep sleep signal 210A and outputs a high signal. Although the output from inverter 225A is high, NAND gate 240A continues to output a high deep sleep signal 210B until gated memory array supply voltage 220A reaches a specified voltage. Once NAND gate 240A receives the gated memory array supply voltage 220A at the specified voltage, the output deep sleep signal 210B is brought low.

Low deep sleep signal 210B causes PFET 215B to turn on and start powering up gated memory array supply voltage 220B. Inverter 225B inverts the low deep sleep signal 210B and outputs a high signal. Although the output from inverter 225B is high, NAND gate 240B continues to output a high deep sleep signal 210C until gated memory array supply voltage 220B reaches a specified voltage. Once NAND gate 240B receives the gated memory array supply voltage 220B at the specified voltage, the output deep sleep signal 210C is dropped low. This circuitry may continue for any number of memory banks.

Figure 3:
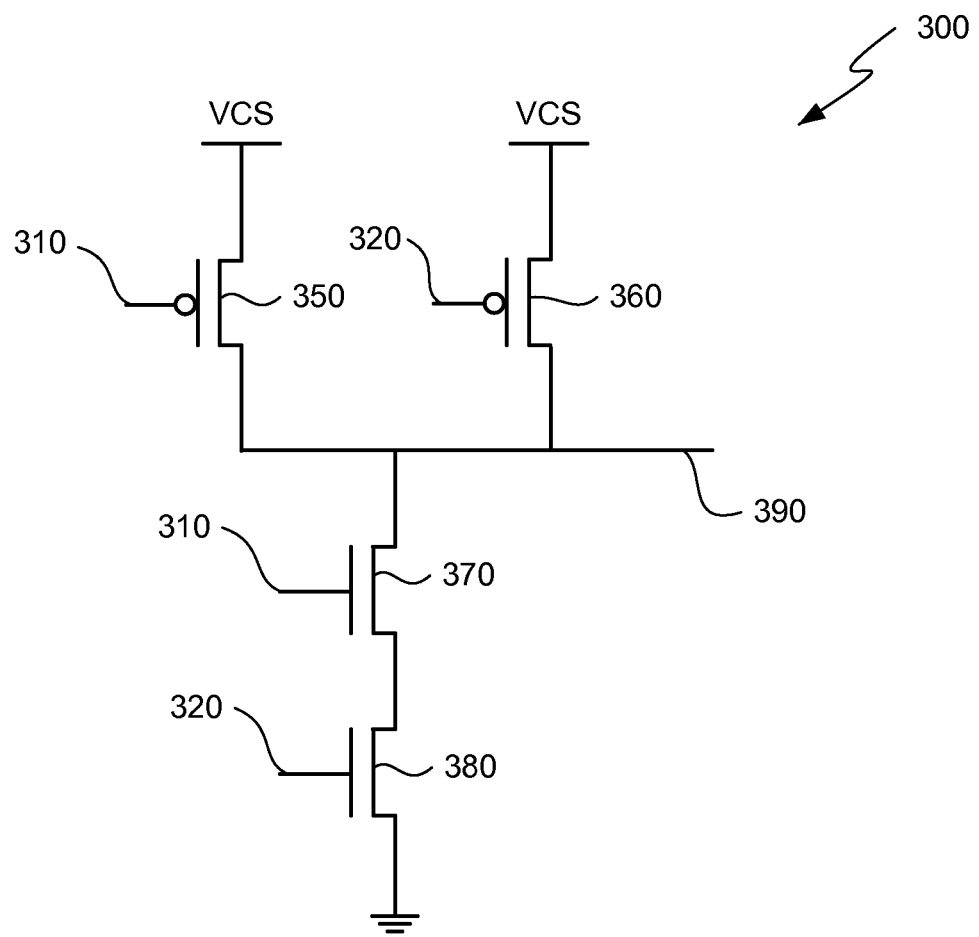
FIG. 3 depicts an example NAND gate for forwarding a deep sleep signal in response to a gated memory array supply voltage reaching a specified voltage.

Referring to FIG. 3, an example NAND gate 300 for forwarding a deep sleep signal in response to a gated memory array supply voltage 320 reaching a specified voltage is depicted. NAND gate 300 may be representative of NAND gates 240A, 240B depicted in FIG. 2. NAND gate 300 includes two p-channel field-effect transistors (PFETs) 350, 360 and two n-channel field effect transistors (NFETs) 370, 380. NAND gate 300 receives two input voltages, inverted deep sleep signal 310 and gated memory array supply voltage 320. Each input 310, 320 controls the gate for a PFET and an NFET.

When both inputs are low, NFETS 370, 380 are off, preventing flow to ground, and PFETS 350, 360 are on, allowing flow from VCS to output 390. The voltage change of inverted deep sleep signal 310 occurs relatively quickly compared to the voltage change of gated memory array supply voltage 320. Thus, shortly after the deep sleep signal is dropped low, inverted deep sleep signal 310 will be high, turning off PFET 350 and turning on NFET 370. However, gated memory array supply voltage 320 is still low with NFET 380 off and PFET 360 on. Therefore, gated memory array supply voltage 310 will determine when output 390 is brought low.

As gated memory array supply voltage 310 increases, the resistance across PFET 360 will increase and the resistance across NFET 380 will decrease. Once memory array supply voltage 320 reaches a specified voltage, the flow through NFET 380 will dominate over the flow through PFET 360 and the output will drop low. The specified voltage is determined by the size ratio of PFET 360 to NFET 380 (P/N ratio). A larger P/N ratio results in a higher specified voltage and a lower P/N ratio results in a lower specified voltage. NAND gate 300 may be skewed toward an input near VCS using a high P/N ratio.

Figure 4:
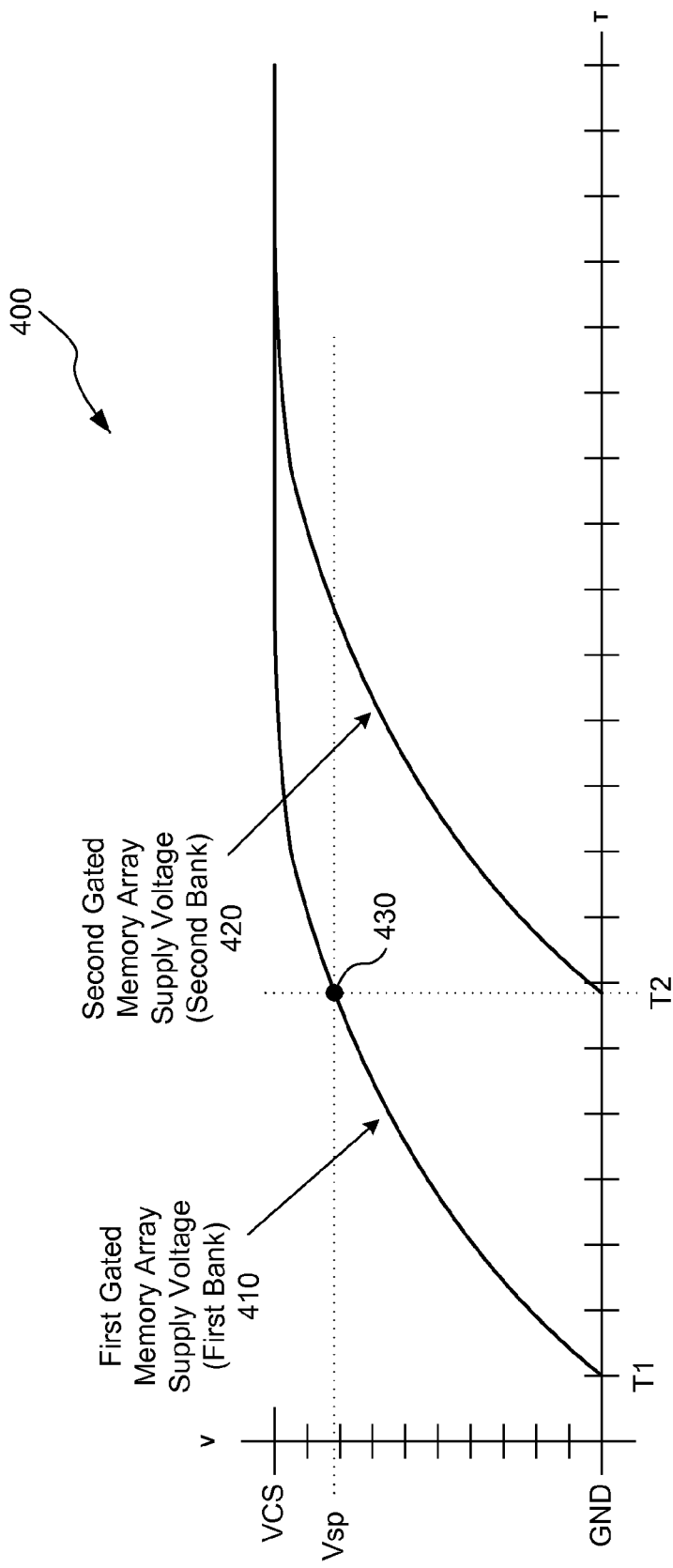
FIG. 4 depicts an example timing graph of gated memory array supply voltages at a first and a second memory bank.

Referring to FIG. 4, an example timing graph 400 of gated memory array supply voltages at a first and a second memory bank is depicted. As depicted, the second gated memory array supply voltage 420 starts increasing once the first gated memory array supply voltage 410 reaches the specified voltage (Vsp).

The first gated memory array supply voltage 410 may start increasing at time T1 in response to receiving a deep sleep wakeup signal. At point 430, the first gated memory array supply voltage 410 reaches Vsp at time T2. The deep sleep wakeup signal may be forwarded to the second memory bank in response to the first gated memory array supply voltage 410 reaching Vsp, which causes the second gated memory array supply voltage 420 to increase. This process could continue for any number of memory banks. For example, a third memory array supply voltage could start increasing once the second memory reaches Vsp and so on for any number of memory banks FIG. 4 is for illustrative purposes only and is not drawn to scale.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system comprising:
   a first memory bank comprising a first memory array, the first memory bank configured to increase a first gated memory array voltage in response to receiving a deep sleep wakeup signal, the first gated memory array voltage applied to the first memory array;
   a second memory bank comprising a second memory array, the second memory bank configured to increase a second gated memory array voltage in response to receiving the deep sleep wakeup signal, the second gated memory array voltage applied to the second memory array; and
   a first deep sleep wakeup delay circuit configured to forward the deep sleep wakeup signal received at the first memory bank to the second memory bank in response to determining the first gated memory array supply voltage has reached a specified voltage.

2. The system of claim 1, further comprising:
   a third memory bank comprising a third memory array; and
   a second deep sleep wakeup delay circuit configured to forward the deep sleep wakeup signal received at the second memory bank to the third memory bank in response to determining the second gated memory array supply voltage has reached the specified voltage.

3. The system of claim 1, wherein the deep sleep wakeup delay circuit comprises:

a NAND gate configured to lower output voltage in response to receiving input at the specified voltage from the first gated memory array supply voltage.

4. The system of claim 1, wherein the first memory bank further comprises a first word line driver, wherein the first gated memory array supply voltage is further applied to the first word line driver, and wherein the second memory bank further comprises a second word line driver, wherein the second gated memory array supply voltage is further applied to the second word line driver.

\* \* \* \* \*